United States Patent
Kumar et al.

(10) Patent No.: US 10,497,872 B2
(45) Date of Patent: Dec. 3, 2019

(54) NEGATIVE DIFFERENTIAL RESISTANCE DEVICES

(71) Applicant: HEWLETT PACKARD ENTERPRISE DEVELOPMENT LP, Houston, TX (US)

(72) Inventors: Suhas Kumar, Palo Alto, CA (US); Kate Norris, Palo Alto, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/331,652

(22) Filed: Oct. 21, 2016

(65) Prior Publication Data
US 2018/0114899 A1 Apr. 26, 2018

(51) Int. Cl.
*H01L 47/00* (2006.01)
(52) U.S. Cl.
CPC .................................. *H01L 47/00* (2013.01)
(58) Field of Classification Search
CPC ... H01L 45/06; H01L 45/1233; H01L 45/128; H01L 45/145; H01L 27/2463; H01L 47/00
USPC ....... 257/4, E21.078; 438/104; 365/148, 159
See application file for complete search history.

(56) References Cited

U.S. PATENT DOCUMENTS

| 5,646,884 | A | 7/1997 | van der Wagt | |
| 8,314,976 | B2 | 11/2012 | Maeshima et al. | |
| 8,525,553 | B1 | 9/2013 | Yi et al. | |
| 8,611,133 | B2 * | 12/2013 | Pickett | G11C 11/39 365/100 |
| 8,767,438 | B2 * | 7/2014 | Yang | G11C 13/0002 365/148 |
| 2012/0014161 | A1 * | 1/2012 | Pickett | H03B 7/06 365/148 |

FOREIGN PATENT DOCUMENTS

| CN | 101183851 | 5/2008 |
| CN | 103107773 | 7/2015 |

OTHER PUBLICATIONS

K.J. Chen. "Logic Synthesis and Circuit Modeling of a Programmable Logic Gate Based on Controlled Quenching of Series-connected Negative Differential Resistance Devices" Feb. 6, 2003, < http://ieexplore.ieee.org/document/1175512/ >.

Li Ding, "A Novel Technique to Improve Noise Immunity of CMOS Dynamic Logic Circuits," Jun. 7-11, 2004, 4 pps, https://pdfs.semanticscholar.org/065/0d536d52ba520323f201d12e86d3ba995b6b.pdf.

* cited by examiner

*Primary Examiner* — Brook Kebede
(74) *Attorney, Agent, or Firm* — Hewlett Packard Enterprise Patent Department

(57) ABSTRACT

Examples herein relate to negative differential resistance devices. An example negative differential resistance device includes a first electrode and a first negative differential resistance device coupled to the first electrode. A second negative differential device is be coupled to the first negative differential resistance device. The second NDR device is different from the first NDR device. A second electrode is coupled to the second NDR device, and is electrically coupled with the first NDR device and the first electrode.

22 Claims, 3 Drawing Sheets

NEGATIVE DIFFERENTIAL RESISTANCE DEVICES

BACKGROUND

In devices that exhibit negative differential resistance ("NDR") properties, an increase in voltage across a device's terminals results in a decrease in electrical current through the device for some parts of the device's current-voltage (I-V) curve.

BRIEF DESCRIPTION OF THE DRAWINGS

The following detailed description references the drawings, wherein.

DETAILED DESCRIPTION

Figure 1B:
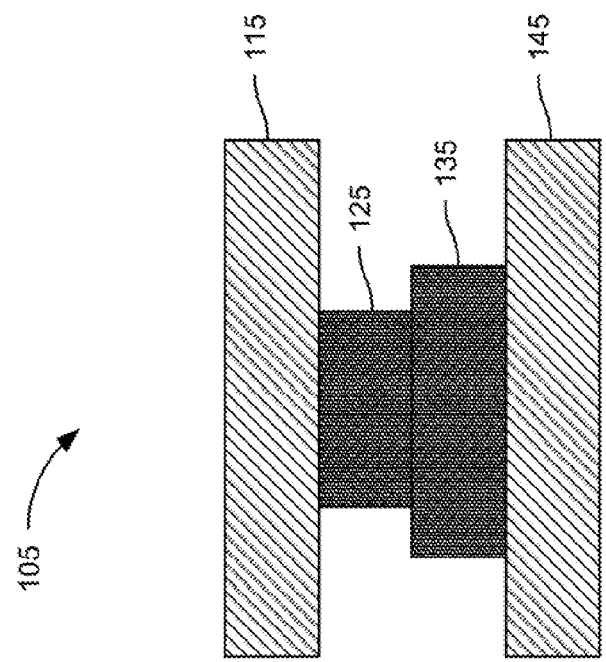
FIG. 1B is a cross-sectional diagram of a second example negative differential resistance device.

As electronic devices are shrinking to nanoscale sizes in order to meet growing consumer demand for data, existing solutions for many circuit-level issues may no longer be employed at the system-level or at a macro-scale. As devices are made smaller and approach the nanoscale, devices may become more susceptible to stability challenges, such as from thermal noise and fluctuations.

Current solutions are generally adaptations of those existing solutions used on typically much larger devices, which may be far less susceptible to thermal noise. Furthermore, these solutions are often active (i.e., continuous consumption of power), or may utilize bulk components such as transistors. Examples disclosed herein provide for negative differential resistance devices that improve stability of integrated circuits against thermal noise, fluctuations, disturbances, and drift, by using two locally active (i.e., do not need continuous power) devices that exhibit negative differential resistance (NDR). Two slightly different NDR elements may restrict voltage across and current through the combination to a narrow window determined by the asymmetry between the NDR elements. In this manner, examples herein provide a compact solution that is compatible with nanoscale fabrication techniques, have two terminals, and can be placed into circuits for stabilization.

Referring now to the drawings. FIG. 1A illustrates a cross-section of a first example negative differential resistance device 100. NDR device 100 may have a first electrode 110 and a first negative differential resistance device 120 coupled to the first electrode 110. A second negative differential device 130 may be coupled to the first negative differential resistance device 120. The second NDR device 130 may be different from the first NDR device 120, as explained in detail herein. A second electrode 140 may be coupled to the second NDR device 130, and may be electrically coupled with the first NDR device 120 and the first electrode 110. As used herein, components may be coupled by forming an electrical connection between the components. For example, the first NDR device 120 may be coupled to the second NDR device 130 by forming a direct, surface contact between the two. As described in detail below, NDR device 100 may have various alternate structures.

First NDR device 110 may be any electronic component, a combination of components, or a sub-division of such a component capable of exhibiting a first negative differential resistance behavior. In devices that exhibit negative differential resistance ("NDR") properties, an increase in voltage across a device's terminals results in a decrease in electrical current through the device for some parts of the device's current-voltage (I-V) curve. This may be in contrast to ordinary resistors in which an increase of applied voltage causes a proportional increase in current due to Ohm's law, resulting in a positive resistance. While a positive resistance consumes power from current passing through it, a negative resistance may produce power. Under certain circumstances, negative resistance may increase power of an electrical signal, thereby amplifying it.

Differential resistance may refer to the ratio of change in voltage to the resulting change in current (i.e., $\Delta v/\Delta i$) or to the ratio of change in current to the resulting change in voltage (i.e., $\Delta i/\Delta v$). Negative differential resistance may refer to behavior where the change in voltage is negative relative to a change in current (i.e., $\Delta v/\Delta i<0$) or to where the change in current is negative relative to a change in voltage (i.e., $\Delta i/\Delta v<0$). The former behavior, where voltage is a function of applied current, is mostly discussed with the examples disclosed herein. In some examples, negative differential resistance behavior may exhibit a hysteresis (non-retracing behavior) when either the voltage across an NDR device or the current through an NDR device is taken from zero to some finite magnitude and then back to zero. This is further illustrated in relation to FIG. 2. Furthermore, NDR behavior may be provided via threshold-voltage-driven current, resistance switching, or a Mott transition within an active material.

Similarly, second NDR device 130 may be any electronic component, a combination of components, or a sub-division of such a component capable of exhibiting a second negative differential resistance behavior. The second negative differential resistance behavior may be different than the first negative differential resistance. For example, the first NDR device 120 may have a first temperature of transition and the second NDR device 130 may have a second temperature of transition. Temperature of transition may be a temperature at which point a material transitions from exhibiting positive differential resistance (i.e., increase in voltage with current in voltage or vice versa) to negative differential resistance (i.e., decrease in voltage with increase in current or vice versa). For example, the temperature of transition may be a temperature that may initiate a Mott transition or other form of NDR threshold.

To achieve the first NDR behavior and the second NDR behavior, the first NDR device 120 may include a first material, and the second NDR device 130 may include a second material. In a specific example, the first material may include niobium oxide, and the second material may include vanadium oxide. In some examples, just a slight difference in NDR behavior may be desired between the two NR devices. In such cases, different types of a certain material may be used, including chemical variations of the material. For instance, the first NDR device 120 may have a crystalline material (e.g., crystalline niobium oxide, vanadium oxide, etc.) and the second NDR device 130 may have an amorphous material (amorphous niobium oxide, vanadium oxide, etc.). Alternatively, the two different NDR behaviors may be caused by differences in the physical dimensions of the first NDR device 120 and the second NDR device 130, which is described in detail below with relation to FIG. 1B.

FIG. 1A shows the first NDR device 120 coupled with the first electrode 110, and the second NDR device 130 coupled with the first NR device 120 and in series with the first electrode 110. It should be noted that this is an example structure, and other structures may be possible for attaining a device exhibiting two slightly different NDR behaviors. For example in alternative cases, the first NDR device 120 and the second NDR device 130 may both be directly coupled to first electrode 110, so that the first NDR device 120 and second NDR device 130 are in electrical parallel.

Furthermore, in some examples, the first NDR device 120 may be a first memristor, and the second NDR device 130 may be a second memristor. A memristor may be a passive two terminal device that can be programmed to different resistive states by applying a programming energy, such as voltage. A memristor may exhibit nonlinear or linear current-voltage behavior. Nonlinear may describe a function that grows differently than a linear function according to Ohm's law. Specifically, a change in voltage may cause a disproportionate change in current, or vice versa.

Second electrode 140 may be coupled to the second NDR device 130 and electrically coupled to the first NDR device 120 and the first electrode 110. FIG. 1A shows the second electrode 140 coupled with the second NDR device 130 and in series with the first NDR device 120 and first electrode 110. It should be noted that this is an example structure, and other structures may be possible. For example in alternative cases, the first NDR device 120 and the second NDR device 130 may both be directly coupled to first electrode 110, so that the first NDR device 120 and second NDR device 130 are in electrical parallel, and the second electrode 140 is coupled to both the first NDR device 120 and the second NDR device 130.

First electrode 110 and second electrode 140 may each be an electrically conducting material that conducts current to first NDR device 120 and second NDR device 130. In some examples, as described further below, first electrode 110 and second electrode 140 may serve as connections between NDR device 100 and other components. For example, first electrode 110 and second electrode 140 may connect NDR device 100 with lines of a circuit system. Example materials for the electrodes may include conducting materials such as Pt, Ta, Hf, Zr, Al, Co, Ni, Fe, Nb, Mo, W, Cu, Ti, TiN, TaN, $Ta_2N$, $WN_2$, NbN, MoN, $TiSi_2$, TiSi, $Ti_5Si_3$, $TaSi_2$, $WSi_2$, $NbSi_2$, $V_3Si$, electrically doped Si polycrystalline, electrically doped Ge polycrystalline, and combinations thereof.

The components of NDR device 100, including first electrode 110, first NDR device 120, second NDR device 130, and second electrode 140 may be nanoscale. Specifically, in some examples, each of the components listed above may be no more than one micron in size in any dimension. Furthermore, in some examples, NDR device 100 itself may be nanoscale. Alternatively, some of the components of NDR device 100 may be nanoscale.

In some examples, NDR device 100 may be a part of an electronic device, and may exhibit a plurality (i.e., two as shown in FIG. 1A) of negative differential resistance behaviors. NDR device 100 may include a first layer 120 with a first negative differential resistance material and a second layer 130 with a second negative differential resistance material different from the first negative differential resistance material.

Figure 1A:
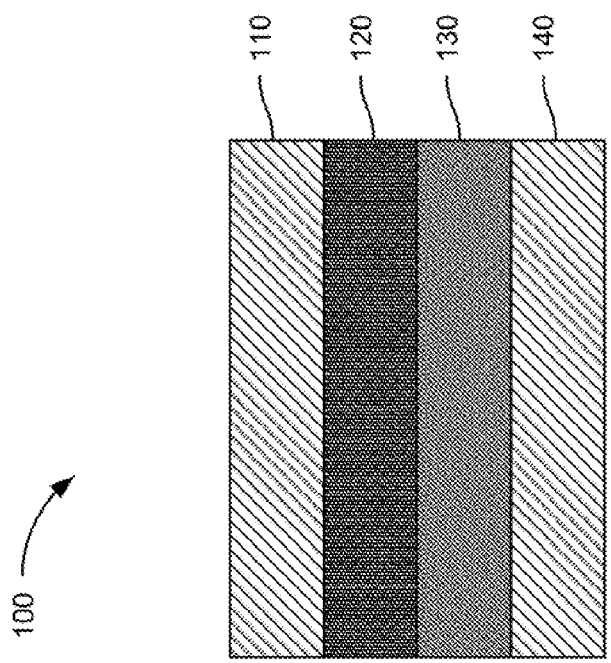
FIG. 1A is a cross-sectional diagram of a first example negative differential resistance device.

FIG. 1B illustrates a cross-section of a second example negative differential resistance device 105. Similar to the device described above in relation to FIG. 1A, NDR device 105 may have a first electrode 115 and a first negative differential resistance device 125 coupled to the first electrode 115. A second negative differential resistance device 135 may be coupled to the first negative differential resistance device 125. The second NDR device 135 may be different from the first NDR device 125. A second electrode 145 may be coupled to the second NDR device 135, and may be electrically coupled with the first NDR device 125 and the first electrode 115.

As described in detail above, first NDR device 125 and second NDR device 135 may be any electronic component, a combination of components, or a sub-division of such a component capable of exhibiting negative differential resistance behavior. The first NDR device 125 may exhibit a first negative differential resistance behavior that is different than a second negative differential resistance behavior exhibited by the second NDR device 135. For example, the first NDR device 125 may have a first temperature of transition and the second NDR device 135 may have a second temperature of transition. As explained above, temperature of transition may be a temperature at which point a material transitions from exhibiting positive differential resistance (i.e., increase in voltage with increase in current or vice versa) to negative differential resistance (i.e., decrease in voltage with increase in current or vice versa). For example, the temperature of transition may be a temperature that may initiate a Mott transition or other form of NDR threshold.

As mentioned above, to achieve the first NDR behavior and the second NDR behavior, the first NDR device 125 may be of a first physical dimension and the second NDR device 135 may be of a second physical dimension. For example, first NDR device 125 may have a different length, width, depth, or other physical dimension than second NDR device 135. In the illustration of FIG. 1B, first NDR device 125 is shown to have a smaller cross-sectional size than the second NDR device 135. It should be noted that FIG. 1B is not to scale, and in some examples, a slight difference in the two NDR devices may cause a sufficient difference in NDR behavior.

It should further be note that in addition to the differences in physical dimensions, the NDR devices may have different materials. For example, the first NDR device 125 may include a first NDR material (e.g., crystalline or amorphous niobium oxide or vanadium oxide), and second NDR device 135 may include a second NDR material (e.g., amorphous or crystalline niobium oxide or vanadium oxide).

Figures 2, 3:
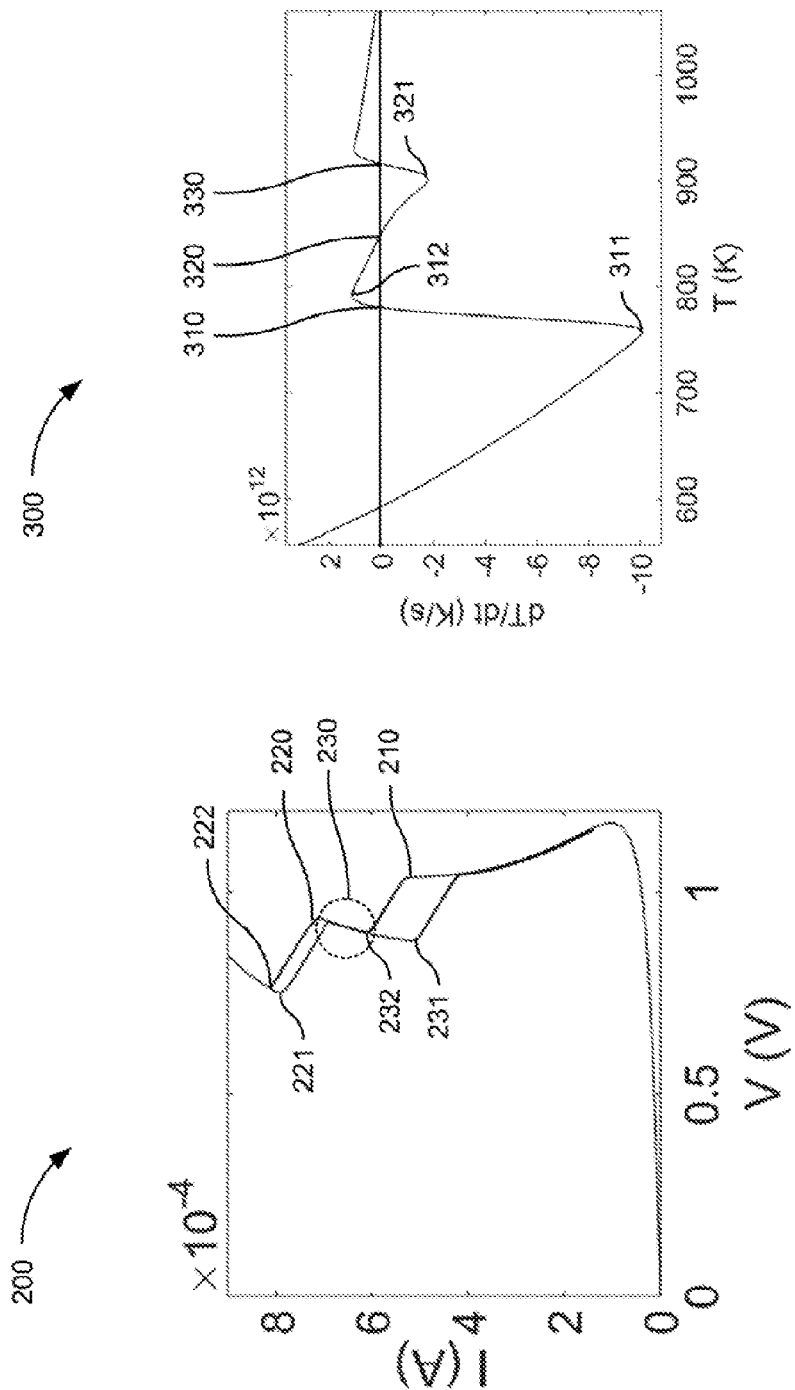
FIG. 2 is a diagram illustrating I-V behavior of an example negative differential resistance device.
FIG. 3 is a diagram illustrating temperature and temperature change behavior of an example negative differential resistance device.

FIG. 2 is an I-V diagram 200 illustrating current-voltage behavior of an example negative differential resistance device, such as example NDR devices 100 or 105. On coordinates of current (A) and voltage (V), diagram 200 illustrates the negative differential resistance behaviors of two NDR devices of an NDR device, such as first NDR device 120 and second NDR device 130 of NDR device 100. Specifically, FIG. 2 may illustrate the I-V behavior of a device exhibiting two slightly different current-controlled negative differential resistance behaviors.

For example, as current is increased from zero, the voltage across the illustrative device may grow positively. At a finite magnitude, the device may begin to exhibit negative differential resistance with a relatively slight drop in voltage with increased current. However, at current level 210, the device exhibits a strong NDR shift. This shift may be caused, for example, by a metal-to-insulator transition or a Mott transition of a first NDR device of the illustrative device. After the shift, the device may enter a stable state illustrated by region 230, where the device may exhibit low positive resistance. Stable region 230 is further illustrated and described herein with relation to FIG. 3. At current level 220, the device may exhibit a second strong NDR shift. This second shift, for example, may be caused by a metal-to-insulator transition or by a Mott transition of a second NDR device of the illustrative device.

When current is dropped from past the current level 220 back to zero, the illustrative device may exhibit a hysteresis. For example, the current level 221 at which the second NDR device exhibits a reverse Mott transition may be lower than highest current level 222 of the sharp NDR zone of the Mott transition initiated at current level 220. Similarly, the current level 231 at which the first NDR device exhibits a reverse Mott transition may be lower than the highest current level 232 of the sharp NDR zone of the Mott transition initiated at current level 210. The hysteresis behavior of the first and second NDR devices causes the boxes illustrated in the I-V diagram 200.

FIG. 3 is a diagram 300 illustrating the relationship between temperature and temperature gradient of a negative differential resistance device, such as NDR device 100 or 105 of FIGS. 1A and 1B. On coordinates of temperature (T) and temperature gradient (dT/dt), diagram 300 illustrates the negative differential resistance behaviors of two NDR devices of an NDR device, such as first NDR device 120 and second NDR device 130 of NDR device 100 in relation to its temperature of transition. Specifically, FIG. 3 may illustrate temperature behavior of a device exhibiting two slightly different current-controlled negative differential resistance behaviors.

For example, at temperature 311, a first NDR device of the illustrative device may undergo a transition, such as a metal-to-insulator transition or a Mott transition. Prior to the temperature 311, the temperature gradient of the device may be negative. The transition may cause the temperature gradient of the device to rise sharply, passing a stable point 310 where the temperature gradient of the device is zero. Upon reaching a peak, the temperature gradient of the device again drops as the temperature of the device is increased, passing a second stable point 320, before reaching temperature 321. At temperature 321, a second NDR device may undergo a transition, where the temperature gradient of the device may rise sharply, passing a third stable point 330.

The two transitions of the device may create a stable zone between temperature 312 at which point the first transition terminated and temperature 321 at which point the second transition initiated. At stable point 320, the temperature gradient may be zero, and the device may tend to stabilize towards stable point 320 while in the stable zone between temperatures 312 and 321. For example, the temperature gradient for the device between temperatures 312 and 320 is positive, therefore the device will tend to heat up until stable point 320. Similarly, the temperature gradient for the device between temperatures 320 and 321 is negative, therefore the device will tend to cool down until stable point 320. The opposite may be true at stable points 310 and 330, where a temperature gradient at a temperature below the stable point may be negative, causing the temperature to decrease away from the stable point. Similarly, a temperature gradient at temperatures above either stable points 310 and 330 may be positive, causing the temperature of the device to increase away from the stable point.

As described previously, the dual NDR behavior illustrated in FIG. 2 and FIG. 3 may be caused by the presence of two different NDR devices, such as first NDR device 120 and second NDR device 130 of NDR device 100. To achieve the first NDR behavior and the second NDR behavior, the first NDR device may include a first material and the second NDR device may include a second material, as described in detail with relation to FIG. 1A. Alternatively, the two different NDR behaviors may be caused by differences in the physical dimensions of the first NDR device and the second NDR device, which was described in detail with relation to FIG. 1B.

Figure 4:
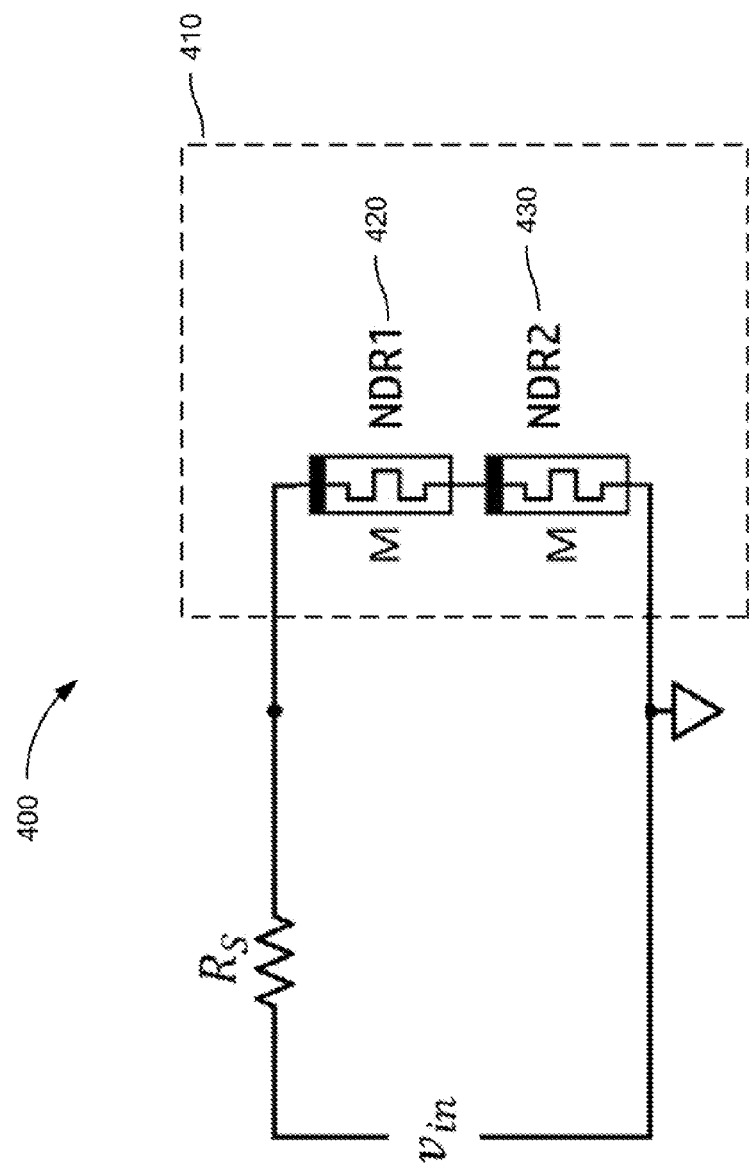
FIG. 4 is a diagram of an example circuit system having an example negative differential resistance device

FIG. 4 illustrates an example circuit system 400 having an example negative differential resistance device 410. Circuit system 400 illustrates the positioning of an example NDR device 410 in any electronic system, including an integrated circuit. As described previously, NDR device 410 may have a first NDR device 420 and a second NDR device 430 with slightly different negative differential resistance behaviors. NDR device 410 may provide circuit stability against thermal noise, electronic fluctuations, electronic noise, drift in device behavior, changes to the operating environment, and alterations in circuit.

Accordingly, NDR device 410 may be integrated in to a circuit by placing the device in the path of the current to be stabilized. NDR device 410 may confine noisy current within certain limits defined by the properties of the device by restricting the limits of the noise. This window of confinement is illustrated by the stable points of FIG. 3. Furthermore, NDR device 410, as taught herein, may be zero-bias, meaning that no additional operational bias or power is needed to operate the device. NDR device 410 may be nanoscale and can be used in nanoscale integrated circuit applications. In some examples, NDR devices 410 and its components may be less than 100 nanometers in any dimension.

The foregoing describes a number of examples for negative differential resistance devices and their applications. It should be understood that the examples described herein may include additional components and that some of the components described herein may be removed or modified without departing from the scope of the examples or their applications. It should also be understood that the components depicted in the figures are not drawn to scale, and thus, the components may have different relative sizes with respect to each other than as shown in the figures.

Further, the sequence of operations described in connection with FIGS. 1-4 are examples and are not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

It should further be noted that, as used in this application and the appended claims, the singular forms "a," "an," and "the" include plural elements unless the context clearly dictates otherwise.

What is claimed is:
1. A device, comprising:
a first electrode;
a first negative differential resistance material coupled to the first electrode;
a second negative differential resistance material coupled to the first negative differential resistance; and a second electrode coupled to the second negative differential resistance material and electrically coupled with the first negative differential resistance material and the first electrode, wherein the first negative differential resistance material exhibits a first negative differential resistance, the second negative differential resistance material exhibits a second negative differential resistance different from the first negative differential resistance, and the first and second negative differential resistances combine to exhibit a third negative differential resistance between the first electrode and the second electrode.

2. The device of claim 1, wherein the first negative differential resistance material comprises a first temperature of transition, and the second negative differential resistance material comprises a second temperature of transition.

3. The device of claim 1, wherein the first negative differential resistance material a different physical dimension than the second negative differential resistance material.

4. The device of claim 1, wherein the first negative differential resistance material comprises a crystalline material, and the second negative differential resistance material comprises an amorphous material.

5. The device of claim 4, wherein the first material comprises a crystalline niobium oxide, and the second material comprises an amorphous niobium oxide.

6. The device of claim 4, wherein the first material comprises a crystalline vanadium oxide, and the second material comprises an amorphous vanadium oxide.

7. The device of claim 1, wherein the first negative differential resistance material undergoes a metal-to-insulator transition at a first applied current, and the second negative differential resistance material undergoes a metal-to-insulator transition at a second applied current.

8. The device of claim 1, wherein the first negative differential resistance material comprises a first memresistive material, and the second negative differential resistance material comprises a second memresistive material.

9. The device of claim 1, wherein a differential resistance between the first and second electrodes is, for a given current direction, positive for a current between a first current value and a second current value, the first current value is associated with a Mott transition point of the first negative differential resistance device, the second current value is associated with a reverse Mott transition point of the second negative differential resistance device, and the second current value is greater than the first current value.

10. The electronic device of claim 1, wherein at least one of the first electrodes or the second electrode comprises a nitride.

11. An electronic device, comprising a negative differential resistance device exhibiting a plurality of negative differential resistance behaviors, the negative differential resistance device comprising:
a first layer comprising a first negative differential resistance material; and
a second layer coupled to the first layer, wherein the second layer comprises a second negative differential resistance material different from the first negative differential resistance material,
wherein the negative differential resistance device has a temperature gradient, the temperature gradient having a zone of stability, the zone of stability comprises a first boundary associated with a first temperature of transition of the first negative differential resistance material, and the zone of stability has a second boundary associated with a second temperature of transition of the second negative differential resistance material.

12. The electronic device of claim 11, wherein the first negative differential resistance material comprises a crystalline niobium oxide, and the second negative differential resistance material comprises an amorphous niobium oxide.

13. The electronic device of claim 11, wherein the first negative differential resistance material undergoes a metal-to-insulator transition at a first applied current, and the second negative differential resistance material undergoes a metal-to-insulator transition at a second applied current.

14. The electronic device of claim 11, wherein the first negative differential resistance material comprises a memristive material, and the second negative differential resistance material comprises a memristive material.

15. The electronic device of claim 11, wherein each of the first layer and the second layer are nanoscale.

16. The electronic device of claim 11, wherein the zone of stability comprises a temperature gradient of zero.

17. The electronic device of claim 11, wherein the first negative differential resistance material comprises a crystalline material, and the second negative differential resistance material comprises an amorphous material.

18. The electronic device of claim 11, wherein the first negative differential resistance material comprises a crystalline material, and the second negative differential resistance material comprises an amorphous material.

19. A system comprising a circuit stability device coupled to a circuit, the circuit stability device comprising:
a first negative differential resistance device coupled in series with the circuit, the first negative differential resistance device comprising a first negative differential resistance material with a first temperature of transition; and
a second negative differential resistance device coupled to the first negative differential resistance device and in series with the circuit, the second negative differential resistance device comprising a second negative differential resistance material with a second temperature of transition,
wherein the circuit stability device has a temperature gradient, the temperature gradient having a zone of stability, the zone of stability comprises a first boundary associated with a first temperature of transition of the first negative differential resistance device, and the zone of stability has a second boundary associated with a second temperature of transition of the second negative differential resistance device.

20. The system of claim 19, wherein the first negative differential resistance device has a different physical dimension than the second negative differential resistance device.

21. The system of claim 19, wherein the first negative differential resistance device undergoes a metal-to-insulator transition at a first applied current, and the second negative differential resistance device undergoes a metal-to-insulator transition at a second applied current.

22. The system of claim 19, wherein each of the first negative differential resistance device and the second negative differential resistance device are less than one micrometer in any dimension.

* * * * *